(12) United States Patent
Wu et al.

(10) Patent No.: US 8,449,671 B2
(45) Date of Patent: May 28, 2013

(54) FABRICATION OF SIC SUBSTRATES WITH LOW WARP AND BOW

(75) Inventors: Ping Wu, Warren, NJ (US); Ilya Zwieback, Township of Washington, NJ (US); Avinesh K. Gupta, Basking Ridge, NJ (US); Edward Semenas, Allentown, PA (US)

(73) Assignee: II-VI Incorporated, Saxonburg, PA (US)

( * ) Notice: Subject to any disclaimer, the term of this patent is extended or adjusted under 35 U.S.C. 154(b) by 643 days.

(21) Appl. No.: 12/664,974

(22) PCT Filed: Jun. 26, 2008

(86) PCT No.: PCT/US2008/068342
§ 371 (c)(1),
(2), (4) Date: Dec. 16, 2009

(87) PCT Pub. No.: WO2009/003100
PCT Pub. Date: Dec. 31, 2008

(65) Prior Publication Data
US 2010/0180814 A1 Jul. 22, 2010

Related U.S. Application Data

(60) Provisional application No. 60/946,424, filed on Jun. 27, 2007.

(51) Int. Cl.
*C30B 23/00* (2006.01)
(52) U.S. Cl.
USPC ........ 117/9; 117/4; 117/8; 117/108; 117/109; 117/952

(58) Field of Classification Search
USPC ............... 117/4, 8, 9, 105, 108, 109, 952
See application file for complete search history.

(56) References Cited

U.S. PATENT DOCUMENTS

| | | | |
|---|---|---|---|
| 5,441,011 A | 8/1995 | Takahaski et al. | |
| 5,725,658 A | 3/1998 | Sawada | |
| 6,508,880 B2 | 1/2003 | Vodakov et al. | |
| 6,780,243 B1 | 8/2004 | Wang et al. | |
| 6,800,136 B2 | 10/2004 | Snyder et al. | |
| 2006/0118037 A1 | 6/2006 | Powell et al. | |

FOREIGN PATENT DOCUMENTS

| | | |
|---|---|---|
| EP | 0712150 A1 | 5/1996 |
| WO | 2008039914 A2 | 4/2008 |

OTHER PUBLICATIONS

Rost et al., "Influence of Nitrogen Doping on the Properties of 4H-SiC Single Crystals Grown by Physical Vapor Transport", Journal of Crystal Growth, 2003, pp. 75-83, vol. 257, Science Direct.

*Primary Examiner* — Bob M Kunemund
(74) *Attorney, Agent, or Firm* — The Webb Law Firm (57) ABSTRACT

A method of fabricating an SiC single crystal includes (a) physical vapor transport (PVT) growing a SiC single crystal on a seed crystal in the presence of a temperature gradient, wherein an early-to-grow portion of the SiC single crystal is at a lower temperature than a later-to-grow portion of the SiC single crystal. Once grown, the SiC single crystal is annealed in the presence of a reverse temperature gradient, wherein the later-to-grow portion of the SiC single crystal is at a lower temperature than the early-to-grow portion of the SiC single crystal.

20 Claims, 4 Drawing Sheets

FABRICATION OF SIC SUBSTRATES WITH LOW WARP AND BOW

BACKGROUND OF THE INVENTION

1. Field of the Invention

The present invention relates to SiC substrates and, more particularly, to a method of fabricating SiC substrates.

2. Description of Related Art

Silicon carbide (SiC) is an important wide-bandgap material used for the development and manufacturing of SiC and GaN semiconductor devices. Silicon carbide is used as a lattice-matched substrate material to grow epitaxial layers of SiC and GaN. High planarity of SiC substrates is crucial for achieving high quality epitaxy and subsequent device processing. Bow and warp are two parameters generally used to characterize the deviation from planarity. Bow is determined as the deviation of the wafer center from the plane, while warp is the maximum deviation of the wafer from the plane. Henceforward, warp is used as a more general term describing the wafer deviation from planarity.

In general terms, warp in SiC wafers may have two sources. One is the geometric effects of the fabrication processes. Typically, SiC ingots are sliced into wafers using multi-wire diamond saws. If the travel of the wires is not planar, the sliced wafers could attain cylindrical, wavy or other shapes. The other source of warp is stress in the wafer, which can be bulk stress induced by the growth process, and stress on the wafer surfaces due to the damage induced by slicing and polishing. In practice, though, these factors are usually convoluted. For example, when a stressed crystal is sliced, the stress resolves through slight bending of the wafers; such bending affects the wires yielding warped wafers.

Reduction of wafer warp can be conventionally addressed through optimization of wafer slicing and polishing. This approach does not address the growth-related bulk stress and, therefore, is only moderately effective, especially in the cases when the growth-related stress is a major contributor to the wafer warp.

For the production of n-type SiC substrates, gaseous nitrogen is commonly used as a donor during crystal growth. In order to achieve the desired electrical resistivity of 0.020 $\Omega \cdot cm$ and below, the nitrogen concentration in the crystal should be high–$10^{18} cm^{-3}$ and above. Previously, Rost et al. (H. J. Rost et al., "*Influence of Nitrogen Doping on the Properties of 4H-SiC Single Crystals Grown by Physical Vapor Transport*", Journal of Crystal Growth, Vol. 257(1-2), (2003), p. 75) reported that warp in SiC wafers increases with increase in the level of nitrogen doping. While the exact mechanism for such warp increase is not clear, it is believed that it is related to spatially nonuniform stress distribution in the crystal. Therefore, at any given doping level, it is desirable to develop a growth method capable of producing silicon carbide crystals with low and uniform stress.

Figure 1:
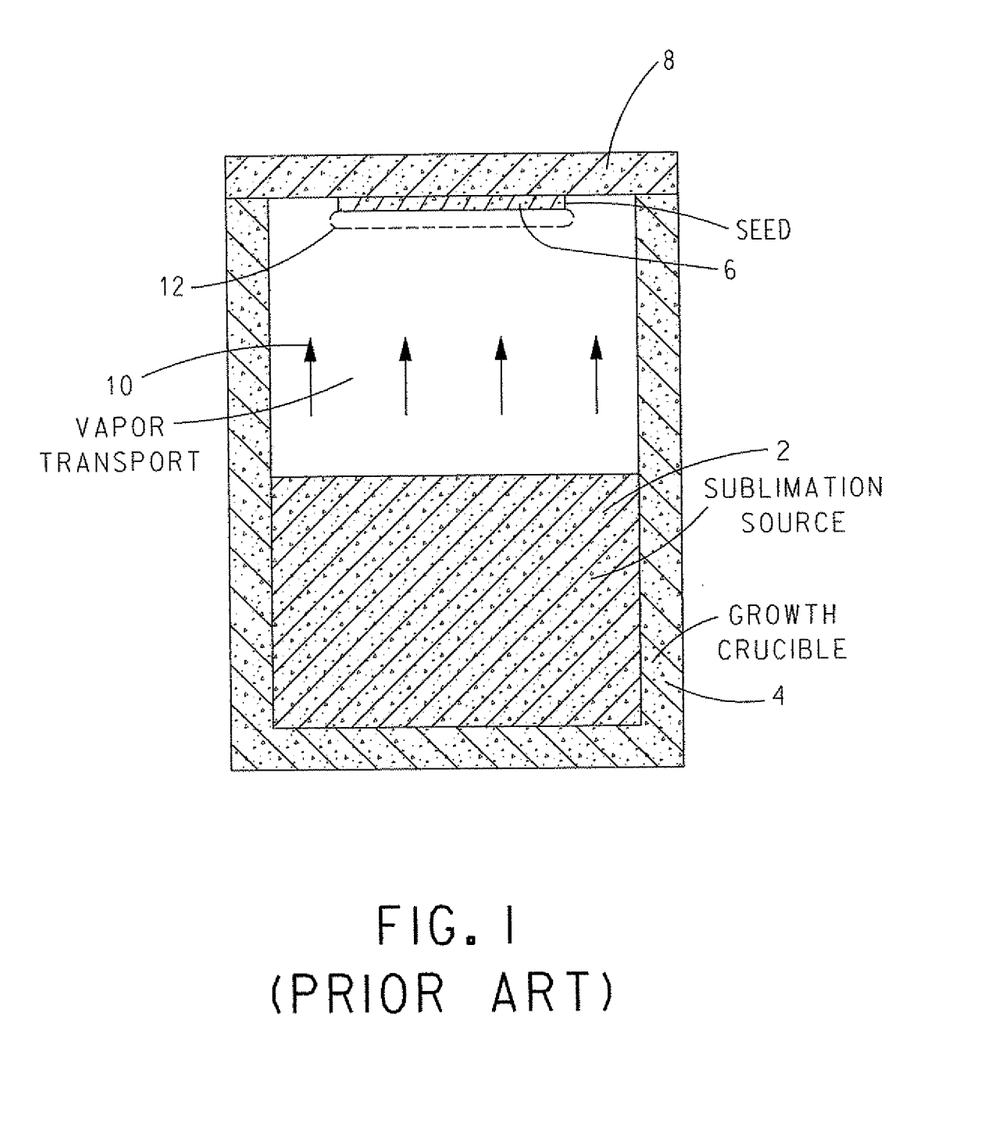
FIG. 1 is a generalized schematic diagram of a prior art physical vapor transport (PVT) growth system.

The most common technique used for the growth of SiC single crystals by sublimation is the technique of Physical Vapor Transport (PVT). A generalized schematic diagram of a PVT growth arrangement is shown in FIG. 1. A sublimation source 2, desirably in the form of polycrystalline SiC grain, is placed at the bottom of a graphite growth crucible 4 and a SiC seed 6 is attached to the container top 8. The loaded container 4 is heated in a manner known in the art to a growth temperature, which is generally between 2000° C. and 2400° C., and a temperature gradient is established between sublimation source 2 and SiC seed 6, whereby the temperature of sublimation source 2 is higher than that of SiC seed 6. At growth temperature sublimation source 2 sublimes and fills the interior of growth container 4 with vapor 10 comprised of silicon- and carbon-carrying volatile molecular species. Driven by the temperature gradient, these species diffuse through the vapor phase in the direction from sublimation source 2 to SiC seed 6. Due to the lower temperature of SiC seed 6, a supersaturation is created causing condensation of vapor 10 on SiC seed 6 and growth of an SiC single crystal boule 12 (shown in phantom) on SiC seed 6.

At high temperatures of sublimation, SiC single crystal boule 12 has a relatively low thermal conductivity. Therefore, the growth of SiC single crystal boule 12 impedes heat dissipation from growth crucible 4 and creates a temperature gradient across SiC single crystal boule 12. This temperature gradient is a source of bulk stress in SIC single crystal boule 12. Furthermore, as the growth progresses, increase in the thickness of SiC single crystal boule 12 causes temperature gradients in SiC single crystal boule 12 to decrease. As a result, the last-to-grow portions of SiC single crystal boule 12 would have a different stress distribution in the bulk of SiC single crystal boule 12 compared to the first-to-grow portions.

In conventional SiC sublimation growth, growth parameters are typically held steady. Therefore, the growth rate is highest at the beginning of growth and then gradually decreases. It is commonly accepted that growth-related stress is influenced by the growth rate. Thus, reduction in the growth rate should contribute to stress nonuniformity throughout SIC single crystal boule 12. The overall result of all of the above factors is a SiC single crystal boule 12 that yields warped wafers.

In U.S. Pat. No. 6,508,880 to Vodakov et al., the inventors carried out a thermal analysis of the SIC growth cell for a specific crystal growth configuration. The performed calculations illustrated the nonuniform nature of the stress distribution in the growing SiC crystal, but did not address the issue of warp in the sliced wafers. No provisions have been made to reduce the spatial stress nonuniformity in the crystal.

U.S. Pat. No. 5,725,658 to Sawada describes a method for reducing warp in III-V semiconductor wafers through a special post-growth thermal treatment applied to the boule. The treatment incorporates a sequence of heating and cooling cycles with interdependent heating and cooling rates. As a result of such thermal cycling, strong transient temperature gradients emerge in the boule bulk leading to spatially more uniform stress distribution. However, application of such treatment to silicon carbide will be inefficient for two reasons. First, the thermal conductivity of SiC is several times higher than that of GaAs or InP; therefore, the temperature gradients produced in SiC using the described thermal cycling will be much lower. Secondly, the technique requires ingots (or boules) with significant length (e.g., 100 mm). Typically, silicon carbide crystals are much shorter (e.g., 10 to 20 mm).

U.S. Pat. No. 5,441,011 to Takahashi et al. describes a method of silicon carbide crystal growth that involves varying the temperature throughout the growth run, with the objective being to obtain SiC crystals of higher quality by reducing the propagation of defects emerging at the interface between the seed and seed-holder. In order to achieve this, a higher initial growth temperature (and thus higher initial growth rate) was used, followed by a gradual temperature decrease. In terms of stress, this invention would make the stress distribution even more nonuniform, making wafer warp worse.

U.S. Pat. No. 6,780,243 to Wang et al. disclosed a SiC growth method aimed at reduction of crystal defects emerging during initial stages of growth. This patent describes a growth process which incorporates the initial stage of very slow growth followed by stepwise reduction of the growth chamber pressure leading to an increased growth rate.

Through most of the growth run, the temperature and pressure are held constant. Implementation of this method, however, does not lead to reduction of nonuniformity of stress distribution in the growing crystal.

SUMMARY OF THE INVENTION

Disclosed is a method of fabricating a SiC single crystal. The method includes: (a) physical vapor transport (PVT) growing a SiC single crystal on a seed crystal in the presence of a temperature gradient, wherein an early-to-grow portion of the SiC single crystal is at a lower temperature than a later-to-grow portion of the SiC single crystal; and (b) annealing the SiC single crystal in the presence of a reverse temperature gradient, wherein the later-to-grow portion of the SIC single crystal is at a lower temperature than the early-to-grow portion of the SiC single crystal.

Step (a) can include growing the SiC single crystal in the presence of an inert gas at a pressure between 1 and 200 torr at a temperature between 1900° C. and 2450° C. The inert gas can include a mixture of argon and nitrogen.

Step (a) can include: (1) PVT growing the SiC single crystal at a temperature T1 between 1900° C. and 2450° C. and a pressure P1 between 1 and 200 torr; and (2) following step (1), PVT growing the SiC single crystal at a temperature T2 that is higher than T1 and a pressure P2 that is lower than P1. T2 can be 10° C. to 100° C. higher than T1. P2 can be 10% to 60% lower than P1.

Step (b) can include annealing the SiC single crystal in the presence of an inert gas at a pressure between 300 and 600 torr at a temperature between 2100° C. and 2550° C. The inert gas can comprise argon, or helium, or argon+nitrogen, or helium+nitrogen.

The early-to-grow part of the SiC single crystal can grow on the SiC seed crystal. The later-to-grow part of the SiC single crystal can be disposed at an end or side of the SiC single crystal opposite the early-to-grow part of the SiC single crystal.

The temperature gradient of step (a) and the reverse temperature gradient of step (b) can have substantially the same temperature range over the SiC single crystal. The temperature range can be between 10° C. and 50° C.

Also disclosed is a method of fabricating a SiC single crystal. The method comprises: (a) providing a growth crucible that is charged with SiC source material at the bottom of the crucible and a SiC seed crystal at the top of the crucible; (b) heating the growth crucible such that: a temperature gradient forms therein with the SIC source material at a first, sublimation temperature and the SiC seed crystal at a second, lower temperature, the temperature gradient causes vapor from the SiC source material to condense on the SiC seed crystal to form the SiC single crystal, and during growth of the SiC single crystal, the temperature gradient causes an early-to-grow part of the SiC single crystal to be at a lower temperature than a later-to-grow part of the SiC single crystal; and (c) following step (b), exposing the SiC single crystal to a reverse temperature gradient having temperatures suitable for annealing the SiC single crystal, whereupon an early-to-grow part of the SiC single crystal is at a higher temperature than the later-to-grow part of the SiC single crystal.

The temperature gradient can include temperatures between 1900° C. and 2450° C. and more desirably between 2000° C. and 2400° C. The reverse temperature gradient can include temperatures between 2100° C. and 2550° C. and more desirably between 2250° C. and 2450° C.

Step (b) can include exposing the SiC single crystal to the temperature gradient in presence of a first inert gas at a pressure between 1 and 200 torr. Step (c) can include exposing the SiC single crystal to the reverse temperature gradient in presence of a second inert gas at a pressure between 300 and 600 torr.

The first inert gas can comprise argon, or helium, or argon+ nitrogen, or helium+nitrogen. The second inert gas can comprise argon, or helium, or argon+nitrogen, or helium+nitrogen.

The early-to-grow part of the SiC single crystal can grow on the SiC seed crystal. The later-to-grow part of the SiC single crystal can be disposed at an end or side of the SiC single crystal opposite the early-to-grow part of the SiC single crystal.

The temperature gradient of step (b) and the reverse temperature gradient of step (c) can have substantially the same temperature difference over the early-to-grow part of the SiC single crystal and the later-to-grow part of the SiC single crystal. The temperature difference can be between 10° C. and 50° C.

Lastly, disclosed is a method of fabricating a SiC single crystal that includes (a) physical vapor transport (PVT) growing a SiC single crystal on a seed crystal for a first interval of time in the presence of a temperature gradient that has a maximum or minimum temperature of T1, wherein, during growth of the SiC single crystal, the temperature gradient causes an early-to-grow portion of the SiC single crystal to be at a lower temperature than a later-to-grow portion of the SiC single crystal; and (b), following step (a), changing said maximum or minimum temperature of the temperature gradient to a temperature T2 that is higher than T1 and PVT growing the SiC single crystal on the seed crystal for a second interval of time with said maximum or minimum temperature of the temperature gradient at temperature T2.

The method can further include (c) annealing the SiC single crystal in the presence of a reverse temperature gradient, wherein the later-to-grow portion of the SiC single crystal is at a lower temperature than the early-to-grow portion of the SiC single crystal.

DETAILED DESCRIPTION OF THE INVENTION

The present invention will be described with reference to the accompanying figures, where like reference numbers correspond to like elements.

It is believed that spatially uniform distribution of growth-related stress in SiC single crystal boules 12 is useful for producing SiC wafers with low warp. In order to achieve this, a two-part growth process is proposed. The first part is a growth process where one or more growth parameters are varied throughout the growth run in a controlled fashion. These one or more variable growth parameters include, without limitation, temperature, pressure, temperature gradient and gas composition of the growth ambient. One of the goals of such variation is to hold the growth rate either constant or slightly increasing throughout growth.

The second part is a post-growth annealing of SiC single crystal boule 12. The annealing conditions are such that the temperature gradient across SiC single crystal boule 12 has an opposite direction, as compared to that during the growth of SiC single crystal boule 12. The benefits of such an annealing process include: (i) reduced level of stress and in SiC single crystal boule 12; and (ii) reduced spatial nonuniformity of stress distribution in SiC single crystal boule 12.

These two parts can be used either separately or in combination.

Figure 2:
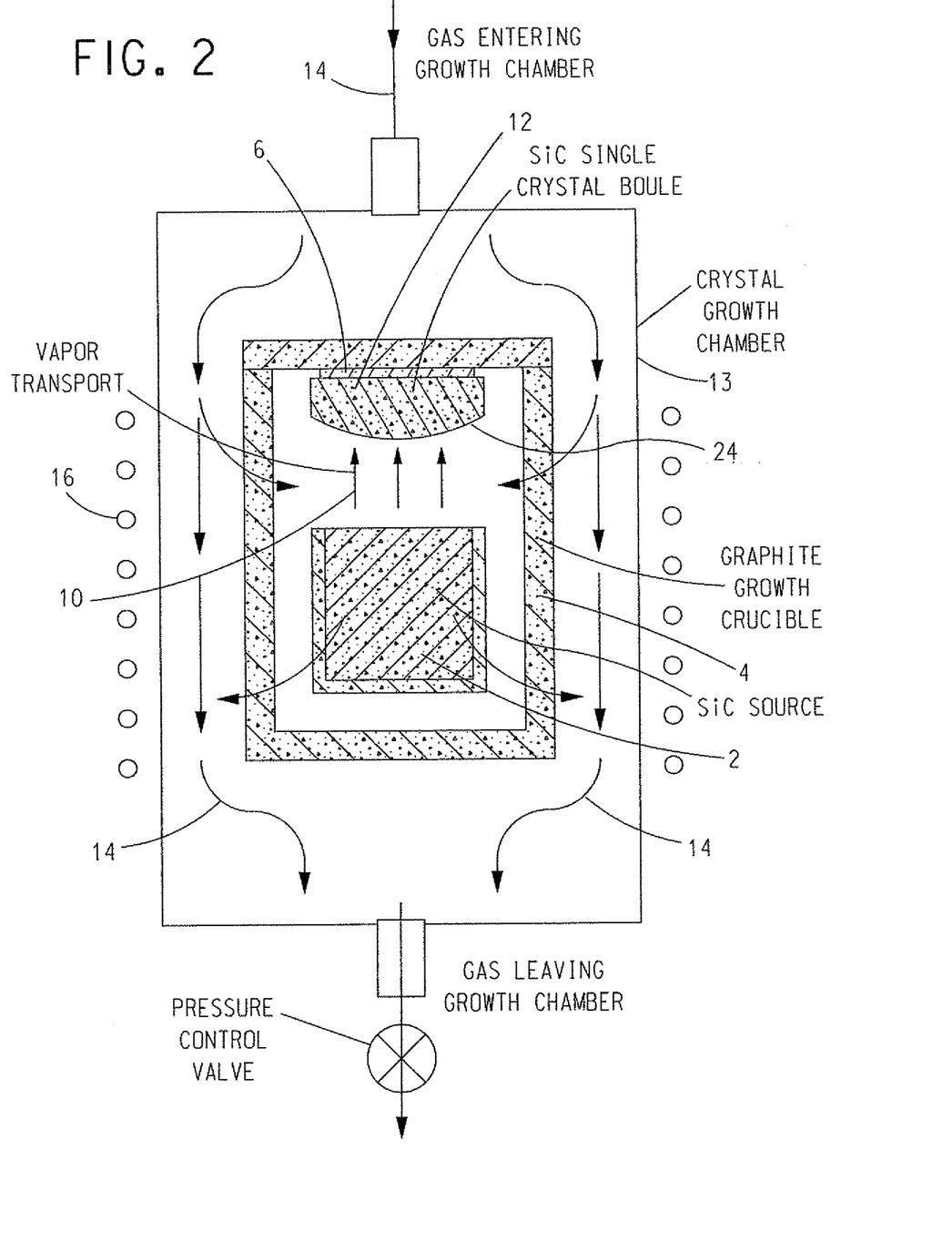
FIG. 2 is a PVT growth system for PVT growing a SiC single crystal in the manner described herein.

FIG. 2 illustrates an exemplary, nonlimiting embodiment of the first part of the process. In FIG. 2, a graphite growth crucible 4 with sublimation source 2, desirably in the form of polycrystalline SiC grain, for example, and SiC seed 6 is placed inside a gas-tight crystal growth chamber 13. Chamber 13 is then evacuated and back-filled with an inert gas 14 comprised of argon, or helium, or argon+nitrogen, or helium+nitrogen to a desired pressure P1. A flow of inert gas 14 is established in chamber 13 while maintaining the desired pressure P1 therein. Because of the porous nature of graphite growth crucible 4, the inert gas 14 introduced into growth crucible 13 and the pressure thereof appears almost immediately within growth crucible 4. Following this, growth crucible 4 is heated via a suitable heating means 16, such as, without limitation, an inductive coil or resistive heater, to a suitable growth temperature T1 and a suitable temperature gradient is established within crucible 4, wherein sublimation source 2 is at a higher temperature than SiC seed 6. Temperature T1 and temperature T2 (discussed hereinafter) can be measured or estimated using conventional means known in SiC growth technology, such as pyrometry and thermal modeling. At these temperatures, sublimation source 2 sublimes and fills the interior of growth crucible 4 with Si—and C-bearing vapors 10. Driven by the temperature gradient, vapors 10 are transported to SiC seed 6 and condense on it forming SiC single crystal boule 12.

Figure 3:
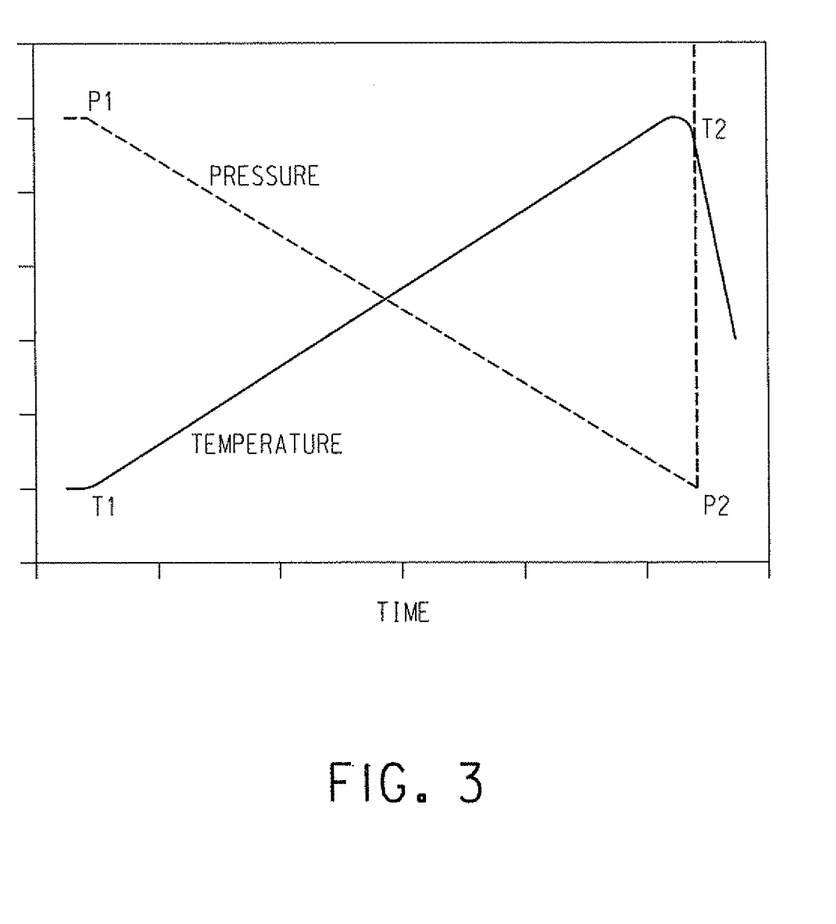
FIG. 3 is a graph of pressure and temperature v. time that occurs in the growth system shown in FIG. 2 during PVT growth of the SiC single crystal in the manner described herein.

With reference to FIG. 3 and with continuing reference to FIG. 2, after proper growth conditions are established in the first part of the process, i.e., with growth crucible 4 at temperature at T1 and pressure P1, the pressure within chamber 13 and, hence, growth crucible 4 is decreased gradually, while the power to heating means 16 is maintained constant. T1 is desirably between 1900° C. and 2450° C., and more desirably between 2000° C. and 2350° C. P1 is desirably between 1 and 100 torr, and more desirably between 5 and 40 torr. Desirably, the rate of pressure decrease in chamber 13 is between 0.01 torr to 1 torr per hour. More desirably, the rate of pressure decrease is between 0.01 torr to 0.1 torr per hour. As the pressure decreases, the same power to heating means 16 leads to higher temperatures in sublimation source 2 and SiC single crystal boule 12 regions of growth crucible 4. Both the reduced pressure and the increased temperature cause the growth rate of SiC single crystal boule 12 to increase. At the end of the growth process, the temperature is at T2 and the pressure is at P2. Desirably, T2 is 10° C. to 100° C. higher than T1, and P2 is lower than P1 by 10% to 60%. Following this, the growth run is terminated by increasing the pressure inside growth chamber 13 and, hence, growth crucible 4 to 500 torr and reducing the power to heating means 16 to zero.

Also or alternatively, the temperature inside growth crucible 4 can be controlled independently of the pressure by gradually changing the input power to heating means 16. The rate of change of the pressure and/or temperature is/are desirably optimized to produce uniform stress distribution and, hence, the lowest warp in wafers cut from SiC single crystal boule 12. In addition to the pressure of gas mixture 10 and the power to heating means 16, other growth process parameters, such as, without limitation, the position of heating means 16 and, hence, the location of the desired temperature gradient within crucible 4 and the composition of inert gas 14 can also be varied. Regarding the temperature gradient inside graphite growth crucible 4, such temperature gradient need not be uniform from the bottom to the top of crucible 4. For example, near the top of crucible 4, the temperature gradient may be greater (or less) than near the bottom of crucible 4. Thus, by appropriate design and positioning of heating means 16, not only can the total temperature gradient within crucible 4 be controlled, but also the location of a desired temperature gradient within crucible 4.

Figure 4:
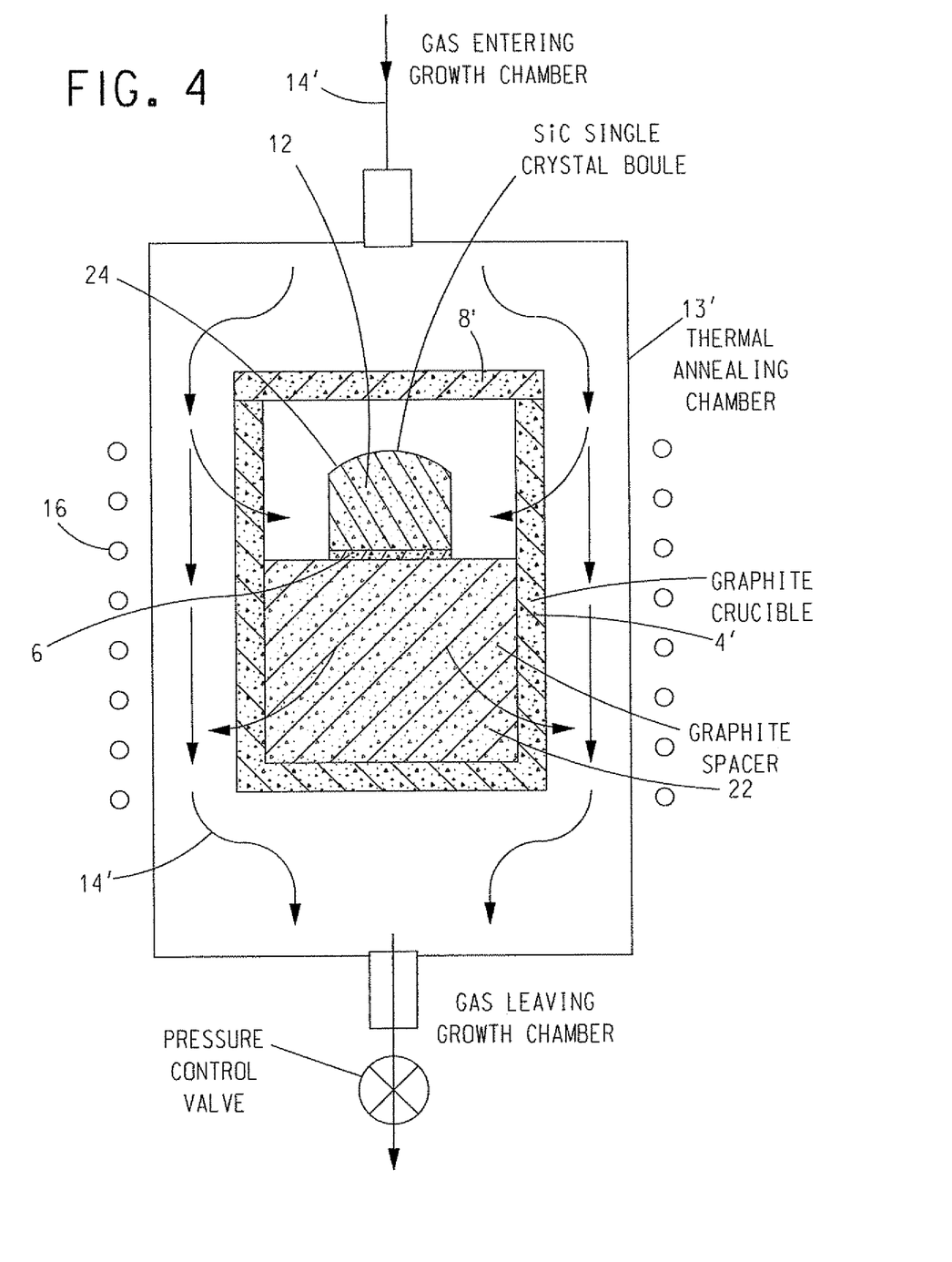
FIG. 4 is a system, like the growth system of FIG. 2, for annealing the PVT grown SiC single crystal boule in the manner described herein.

With reference to FIG. 4 and with continuing reference to FIGS. 1-3, as is well known to anyone familiar with the art of SiC crystal growth by PVT, SiC single crystal boule 12 is situated at a lower temperature than sublimation source 2 in the process of growing SiC single crystal boule 12. Furthermore, the early-to-grow portion of SiC single crystal boule 12 (i.e., the portion of SiC single crystal boule 12 closest to SiC seed 6) is at a lower temperature than the last-to-grow portion of SiC single crystal boule 12. The last-to-grow portion of SiC single crystal boule 12 is also called the growth interface. In a grown SiC single crystal boule 12, the last-to-grow portion has a dome shaped end 24.

The second part of the process comprises post-growth thermal annealing of SiC single crystal boule 12, wherein the temperature gradient is in the opposite direction to the temperature gradient that existed during the growth of SiC single crystal boule 12. In essence, the early-to-grow portion of SiC single crystal boule 12 is heated to a higher temperature than the last- or later-to-grow portion(s).

As shown in FIG. 4, the as-grown SiC single crystal boule 12 can be placed in a graphite growth crucible 4' (e.g., like graphite growth crucible 4) positioned in the interior of a gas-tight, thermal annealing chamber 13' (e.g., like crystal growth chamber 13). Growth crucible 4' may include other parts, such as, without limitation, a graphite spacer 22, shields, and SiC source material. Annealing chamber 13' is then evacuated and back-filled with an inert gas 14' (e.g., like inert gas 14) desirably to a pressure between 300 and 600 torr. SiC single crystal boule 12 is then heated (e.g., via heating means 16) to an annealing temperature, which is desirably comparable to or higher than the growth temperature. Desirably, the annealing temperature is between 2100° C. and 2550° C., and more desirably between 2250° C. and 2450° C.

The temperature gradient across SiC single crystal boule 12 during annealing is in the opposite direction as compared to that during crystal growth. That is, the temperature at the SiC seed end 6 of SiC single crystal boule 12 is higher than that at the dome end 24 (or last-to-grow portion) of SiC single crystal boule 12. Desirably, the temperature difference between the two ends of SiC single crystal boule 12 is similar to that during growth. Desirably, this temperature difference is between 10° C. and 50° C. Thermal annealing is desirably carried out for 1 to 50 hours and more desirably for 8 to 24 hours. As an example, the required annealing temperature gradient can be achieved by loading the grown SiC single crystal boule 12 in chamber 13' in a direction opposite to the direction it was during growth. As shown in FIG. 4, the as-grown SiC single crystal boule 12 is desirably placed on a graphite pedestal (spacer) 22 such that the last-to-grow portion (or dome end 24) faces upward, while the SiC seed end 6 faces downward. Although FIG. 4 shows only one SiC single crystal boule 12, multiple crystals 12 can be annealed in this manner at the same time.

In another embodiment of the second part of the invention, the as-grown SiC single crystal boule 12 is annealed in-situ in growth chamber 13 immediately following the completion of the growth of SiC single crystal boule 12. In this embodiment, once the growth of SiC single crystal boule 12 is complete, the transport of vapor 10 is reduced to zero by increasing the pressure of inert gas 14 in the growth chamber 13, desirably to a pressure between 400 and 600 torr. Following this, heating means 16 is controlled to reverse the direction of the temperature gradient in growth chamber 13 and, hence, in the grown SiC single crystal boule 12, whereupon a temperature gradient is formed in a direction opposite to that during the growth of SiC single crystal boule 12. For example, where heating means 16 is an RF coil, the position of the coil can be adjusted (raised or lowered) relative to growth crucible 13 to change the direction of the temperature gradient in the grown SiC single crystal boule 12. Also or alternatively, where heating means 16 comprises a plurality of independently controlled heaters or RF coils, the power input to each heater or coil can be adjusted to cause SiC single crystal boule 12 to be exposed to a reverse temperature gradient to the direction of the temperature gradient used for growing SiC single crystal boule 12.

Application of the foregoing first growth process to SiC single crystal boule 12 shows that SiC single crystal boules 12 grown with continuously decreasing pressure and, at the same time, continuously increasing temperature yields SiC single crystal wafers with lower warp, compared to wafers produced by a conventional growth process, where both temperature and pressure are held constant. SiC single crystal boules 12 annealed using the reverse temperature gradient described above also yielded SiC single crystal wafers with lower warp.

As can be seen, the present invention includes the following features:

1. SiC single crystal boule growth by sublimation, in which the growth conditions are controlled to vary continuously throughout the growth period to achieve reduced stress gradient(s) in the SiC single crystal boule.

2. Post-growth SiC single crystal boule annealing, in which the temperature gradient is controlled to be in the opposite (or reverse) direction, as compared to that during growth, namely, the early-to-grow portion of the SiC single crystal boule is heated to higher temperature than the last- or later-to-grow portion.

3. SiC single crystal wafers having low bow and warp sliced from SiC single crystal boules produced using the process of #1 or #2, or both #1 and #2.

4. SiC single crystal boule growth by the process of #1, in which the growth conditions are controlled to vary continuously throughout the growth period to achieve a constant growth rate.

5. SiC single crystal boule growth by the process of #1, in which the growth conditions are controlled to vary continuously throughout the growth period to achieve a gradually increasing growth rate.

6. SiC single crystal boule growth by the process of #1, in which the temperature of the growth chamber is controlled to increase continuously during growth, while other parameters are maintained constant.

7. SiC single crystal boule growth by the process of #1, in which the pressure of the inert gas atmosphere in which the SiC single crystal boule is grown is controlled to reduce continuously during growth, while other growth parameters are maintained constant.

8. SiC single crystal boule growth by the process of #1, in which both temperature increase and pressure decrease occur simultaneously during growth.

9. SiC single crystal boule post-growth thermal annealing by the process of #2, in which the SiC single crystal boule is desirably held at an average temperature of between 2100° C. and 2550° C., and more desirably between 2250° C. and 2450° C.

10. SiC single crystal boule post-growth thermal annealing by the process of #2, in which the SiC seed end of the SiC single crystal boule is heated to a temperature higher than the last-to-grow end of the SiC single crystal boule, and the temperature difference is desirably between 10° C. and 50° C. degrees.

The above-described process of producing SiC single crystal boules will lead to SiC single crystal wafers having reduced bow and warp and is expected to significantly increase the yield of prime quality SiC single crystal wafers, especially 4H n-type SiC single crystal wafers used for power-switching semiconductor devices.

EXAMPLE 1

First and second 4H SiC single crystal boules 12 were grown in respective first and second growth runs in the manner described above in an atmosphere of argon and nitrogen at a total initial pressure of 12 torr. The SiC seed 6 and sublimation source 2 temperatures were 2070° C. and 2130° C., respectively. During growth, the total pressure in the growth chamber 4 for each run was decreased gradually. At the end of the first and second growth runs, the pressure in growth chamber 4 was 8 torr and 6 torr, respectively.

The grown SiC single crystal boules were ground to a diameter of 3" and sliced with a multi-wire saw using standard fabrication processes. The average warp of the as-sliced wafers extracted from the first SiC single crystal boule was 31.2 μm and the average warp of the as-sliced wafers extracted from the second SiC single crystal boule was 28.3 μm, about 25% less than the warp values typical for wafers sliced from SiC single crystal boules grown conventionally.

The above-described growth process did not negatively affect other critical aspects of the qualities of the wafers extracted from the SiC single crystal boules, such as material resistivity, defect density, and x-ray quality.

EXAMPLE 2

A third SiC single crystal boule, grown in the same manner as the first and second SiC single crystal boules, was subjected to post-growth thermal annealing using the reverse temperature gradient described above compared to that during the growth of the third SiC single crystal boule. Upon slicing, the third SiC single crystal boule yielded as-sawn SiC single crystal wafers with an average warp of 22.7 μm. After polish, the average warp and bow were 15.0 μm and 6.2 μm, respectively. These values are 50% to 70% lower than values typical for 3" 4H SiC single crystal wafers extracted from SiC single crystal boules produced conventionally.

The present invention has been described with reference to the preferred embodiments. Obvious modifications and alterations will occur to others upon reading and understanding the preceding detailed description. It is intended that the invention be construed as including all such modifications and alterations in so far as they come within the scope of the appended claims or the equivalents thereof.

The invention claimed is:

1. A method of fabricating a SiC single crystal comprising:
   (a) physical vapor transport (PVT) growing a SiC single crystal on a seed crystal in the presence of a temperature gradient, wherein an early-to-grow portion of the SiC single crystal is at a lower temperature than a later-to-grow portion of the SiC single crystal; and (b) annealing the SiC single crystal in the presence of a reverse temperature gradient, wherein the later-to-grow portion of the SiC single crystal is at a lower temperature than the early-to-grow portion of the SiC single crystal.

2. The method of claim 1, wherein step (a) includes growing the SiC single crystal in the presence of an inert gas at a pressure between 1 and 200 torr at a temperature between 1900° C. and 2450° C.

3. The method of claim 2, wherein the inert gas comprises argon, or helium, or argon+nitrogen, or helium+nitrogen.

4. The method of claim 1, wherein step (a) includes:
   (1) PVT growing the SiC single crystal at a temperature T1 between 1900° C. and 2450° C. and a pressure P1 between 1 and 200 torr; and
   (2) following step (1), PVT growing the SiC single crystal at a temperature T2 that is higher than T1 and a pressure P2 that is lower than P1.

5. The method of claim 4, wherein T2 is 10 to 100 degrees C. higher than T1, and P2 is 10% to 60% lower than P1.

6. The method of claim 1, wherein step (b) includes annealing the SiC single crystal in the presence of an inert gas at a pressure between 300 and 600 torr at a temperature between 2100° C. and 2550° C.

7. The method of claim 6, wherein the inert gas comprises argon, or helium, or argon+nitrogen, or helium+nitrogen.

8. The method of claim 1, wherein:
   the early-to-grow part of the SiC single crystal grows on the SiC seed crystal; and
   the later-to-grow part of the SiC single crystal is disposed at an end or side of the SiC single crystal opposite the early-to-grow part of the SiC single crystal.

9. The method of claim 1, wherein the temperature gradient of step (a) and the reverse temperature gradient of step (b) have substantially the same temperature difference over the SiC single crystal.

10. The method of claim 9, wherein the temperature difference is between 10° C. and 50° C.

11. A method of fabricating a SiC single crystal comprising:
   (a) providing a growth crucible that is charged with SiC source material at a bottom of the crucible and a SiC seed crystal at a top of the crucible;
   (b) heating the growth crucible such that:
      a temperature gradient forms therein with the SiC source material at a first, sublimation temperature and the SiC seed crystal at a second, lower temperature,
      the temperature gradient causes vapor from the SiC source material to condense on the SiC seed crystal to form the SiC single crystal, and
      during growth of the SiC single crystal, the temperature gradient causes an early-to-grow part of the SiC single crystal to be at a lower temperature than a later-to-grow part of the SiC single crystal; and
   (c) following step (b), exposing the SiC single crystal to a reverse temperature gradient having temperatures suitable for annealing the SiC single crystal, whereupon a early-to-grow part of the SiC single crystal is at a higher temperature than the later-to-grow part of the SiC single crystal.

12. The method of claim 11, wherein:
   the temperature gradient includes temperatures between 1900° C. and 2450° C.; and
   the reverse temperature gradient includes temperatures between 2100° C. and 2550° C.

13. The method of claim 12, wherein:
   the temperature gradient includes temperatures between 2000° C. and 2400° C.; and
   the reverse temperature gradient includes temperatures between 2250° C. and 2450° C.

14. The method of claim 11, wherein:
   step (b) includes exposing the SiC single crystal to the temperature gradient in presence of a first inert gas at a pressure between 1 and 200 torr; and
   step (c) includes exposing the SiC single crystal to the reverse temperature gradient in presence of a second inert gas at a pressure between 300 and 600 torr.

15. The method of claim 14, wherein:
   the first inert gas comprises argon, or helium, or argon+nitrogen, or helium+nitrogen; and
   the second inert gas comprises argon, or helium, or argon+nitrogen, or helium+nitrogen.

16. The method of claim 11, wherein:
   the early-to-grow part of the SiC single crystal grows on the SiC seed crystal; and
   the later-to-grow part of the SiC single crystal is disposed at an end or side of the SiC single crystal opposite the early-to-grow part of the SiC single crystal.

17. The method of claim 11, wherein the temperature gradient of step (b) and the reverse temperature gradient of step (c) have substantially the same temperature difference over the SiC single crystal.

18. The method of claim 17, wherein the temperature difference is between 10° C. and 50° C.

19. A method of fabricating a SiC single crystal comprising:
   (a) physical vapor transport (PVT) growing a SiC single crystal on a seed crystal for a first interval of time in the presence of a temperature gradient that has a maximum or minimum temperature of T1, wherein, during growth of the SiC single crystal, the temperature gradient causes an early-to-grow portion of the SiC single crystal to be at a lower temperature than a later-to-grow portion of the SiC single crystal; and
   (b) following step (a), changing said maximum or minimum temperature of the temperature gradient to a temperature T2 that is higher than T1 and PVT growing the SiC single crystal on the seed crystal for a second interval of time with said maximum or minimum temperature of the temperature gradient at temperature T2.

20. The method of claim 19, further including:
   (c) annealing the SiC single crystal in the presence of a reverse temperature gradient, wherein the later-to-grow portion of the SiC single crystal is at a lower temperature than the early-to-grow portion of the SiC single crystal.

* * * * *

UNITED STATES PATENT AND TRADEMARK OFFICE
CERTIFICATE OF CORRECTION

| | | |
|---|---|---|
| PATENT NO. | : 8,449,671 B2 | Page 1 of 1 |
| APPLICATION NO. | : 12/664974 | |
| DATED | : May 28, 2013 | |
| INVENTOR(S) | : Ping Wu et al. | |

It is certified that error appears in the above-identified patent and that said Letters Patent is hereby corrected as shown below:

On the Title Page, Column 1, Item (86), § 371 (c)(1), (2), (4) Date, delete "Dec. 16, 2009" and insert -- Mar. 03, 2010 --

Signed and Sealed this
Twelfth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,449,671 B2 Page 1 of 1
APPLICATION NO. : 12/664974
DATED : May 28, 2013
INVENTOR(S) : Wu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 708 days.

Signed and Sealed this
Eighth Day of September, 2015

Michelle K. Lee
*Director of the United States Patent and Trademark Office*